(12) United States Patent
　　　Okawa et al.

(10) Patent No.: US 12,610,756 B2
(45) Date of Patent: Apr. 21, 2026

(54) METHOD OF MANUFACTURING NITRIDE SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Takashi Okawa, Nisshin (JP); Kenta Watanabe, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 675 days.

(21) Appl. No.: 17/832,809

(22) Filed: Jun. 6, 2022

(65) Prior Publication Data

US 2022/0406597 A1　　Dec. 22, 2022

(30) Foreign Application Priority Data

Jun. 17, 2021　　(JP) ................................. 2021-100863

(51) Int. Cl.
　　*H01L 21/02*　　　　(2006.01)
　　*C30B 25/02*　　　　(2006.01)
　　　　　　(Continued)

(52) U.S. Cl.
　　CPC ........ *H01L 21/02579* (2013.01); *C30B 25/02* (2013.01); *C30B 29/403* (2013.01); *C30B 29/406* (2013.01); *C30B 29/68* (2013.01);

*C30B 33/02* (2013.01); *H01L 21/0254* (2013.01); *H01L 21/0262* (2013.01)

(58) Field of Classification Search
None
See application file for complete search history.

(56) References Cited

U.S. PATENT DOCUMENTS

| | | | | |
|---|---|---|---|---|
| 5,306,662 A | * | 4/1994 | Nakamura | ....... H10H 20/01335 438/509 |
| 6,337,493 B1 | * | 1/2002 | Tanizawa | ............. H10H 20/825 257/94 |

(Continued)

FOREIGN PATENT DOCUMENTS

| | | |
|---|---|---|
| CN | 111613527 A | 9/2020 |
| JP | 2003-124515 A | 4/2003 |
| JP | 2019-79930 A | 5/2019 |

OTHER PUBLICATIONS

U.S. Appl. No. 17/833,307, filed Jun. 6, 2022, Watanabe et al.

*Primary Examiner* — Dale E Page
*Assistant Examiner* — Patrick Cullen
(74) *Attorney, Agent, or Firm* — Posz Law Group, PLC

(57) ABSTRACT

A manufacturing method of a nitride semiconductor device includes: introducing a p type impurity into at least a part of an upper layer portion of a first nitride semiconductor layer to form a p type impurity introduction region; forming a second nitride semiconductor layer from an upper surface of the first nitride semiconductor layer so as to include the p type impurity introduction region; and performing an anneal treatment in a state where the second nitride semiconductor layer is formed on the first nitride semiconductor layer.

7 Claims, 4 Drawing Sheets

(51) Int. Cl.
 C30B 29/40 (2006.01)
 C30B 29/68 (2006.01)
 C30B 33/02 (2006.01)

(56) References Cited

U.S. PATENT DOCUMENTS

| | | | | |
|---|---|---|---|---|
| 2002/0043208 A1* | 4/2002 | Biwa | ...................... | C30B 25/02 |
| | | | | 117/94 |
| 2008/0308843 A1 | 12/2008 | Twynam | | |
| 2009/0114900 A1* | 5/2009 | Udagawa | ............. | H10H 20/812 |
| | | | | 257/E31.11 |
| 2012/0217511 A1 | 8/2012 | Renaud et al. | | |
| 2013/0193486 A1* | 8/2013 | Kinoshita | .............. | H10D 30/47 |
| | | | | 257/194 |
| 2014/0091364 A1 | 4/2014 | Imanishi et al. | | |
| 2014/0291725 A1 | 10/2014 | Ishiguro et al. | | |
| 2015/0243494 A1* | 8/2015 | Hayden | ................ | C30B 23/025 |
| | | | | 117/106 |
| 2017/0054015 A1 | 2/2017 | Nakata | | |
| 2018/0019322 A1 | 1/2018 | Takashima et al. | | |
| 2019/0021623 A1* | 1/2019 | Ram | ................... | A61B 5/0006 |
| 2021/0043737 A1* | 2/2021 | Takashima | ........... | H10D 62/157 |

* cited by examiner

METHOD OF MANUFACTURING NITRIDE SEMICONDUCTOR DEVICE

CROSS REFERENCE TO RELATED APPLICATION

The present application claims the benefit of priority from Japanese Patent Application No. 2021-100863 filed on Jun. 17, 2021. The entire disclosure of the above application is incorporated herein by reference.

TECHNICAL FIELD

The technique disclosed herein relates to a method of manufacturing a nitride semiconductor device including a nitride semiconductor layer.

BACKGROUND

In order to manufacture a nitride semiconductor device, a technique of introducing a p type impurity into a nitride semiconductor layer and activating the introduced p type impurity to form a p type diffusion region is required. A conceivable technique provides an example of a technique for forming a p type diffusion region in a nitride semiconductor layer.

SUMMARY

According to an example, a manufacturing method of a nitride semiconductor device includes: introducing a p type impurity into at least a part of an upper layer portion of a first nitride semiconductor layer to form a p type impurity introduction region; forming a second nitride semiconductor layer from an upper surface of the first nitride semiconductor layer so as to include the p type impurity introduction region; and performing an anneal treatment in a state where the second nitride semiconductor layer is formed on the first nitride semiconductor layer.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
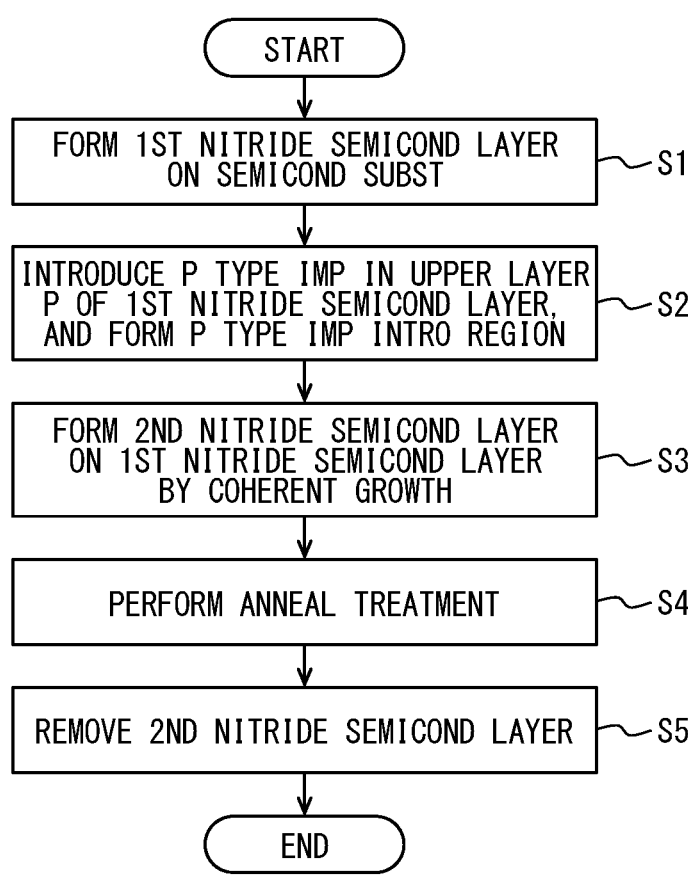
FIG. 1 is a flowchart of a part of a method for manufacturing a nitride semiconductor device.

The present embodiments provide a novel technique for activating a p type impurity introduced into a nitride semiconductor layer.

The method for manufacturing a nitride semiconductor device disclosed in the present embodiments includes: a p type impurity introducing step for introducing a p type impurity into at least a part of an upper layer portion of a first nitride semiconductor layer to form a p type impurity introduction region; a film forming step for forming a second nitride semiconductor layer on an upper surface of the first nitride semiconductor layer so as to include the p type impurity introduction region, wherein the second nitride semiconductor layer is formed by coherently growth in the film forming step; and an anneal treatment step for performing anneal treatment under a condition that the second nitride semiconductor layer is formed on the first nitride semiconductor layer.

The energy required to activate the p type impurity depends on the position of the Fermi level in the region where the p type impurity is introduced, and the closer the position of the Fermi level is to the valence band, that is, when the region where the p type impurity is introduced is a n type, the energy is lowered. According to the above manufacturing method, by forming the second nitride semiconductor layer formed by coherent growth on the first nitride semiconductor layer, a two-dimensional electron gas layer (2 DEG) is generated by piezo-polarization in the upper layer portion of the first nitride semiconductor layer, and the upper layer portion of the first nitride semiconductor layer becomes a n type region. Therefore, at least a part of the p type impurity introduction region formed in the upper layer of the first nitride semiconductor layer may be located in the n type region. According to the above manufacturing method, since the anneal treatment is performed in a state where the upper layer portion of the first nitride semiconductor layer is a n type region, the p type impurity in the p type impurity introduction region is activated with low energy. As a result, the above-mentioned manufacturing method can form a highly active p type region.

Hereinafter, a method of manufacturing a nitride semiconductor device including a nitride semiconductor layer will be described with reference to the drawings. In the following, a process from the ion implantation process to the annealing process for activating the implanted p type impurities will be described in the process of manufacturing the nitride semiconductor device. For the steps other than these in the steps of manufacturing the nitride semiconductor device, well-known manufacturing methods can be used.

As used herein, the "nitride semiconductor" is a compound defined by $In_XAl_YGa_{1-X-Y}N$ (where $0 \leq X \leq 1$, $0 \leq Y \leq 1$). Further, aluminum gallium nitride (AlGaN) is a nitride semiconductor corresponding to X=0, and 0<Y<1 in the above definition. Indium aluminum nitride (InAlN) is a nitride semiconductor corresponding to X+Y=1, 0<X<1, and 0<Y<1 as defined above.

FIG. 1 is a flowchart of a part of a method for manufacturing a nitride semiconductor device. FIGS. 2 to 6 schematically show cross-sectional views of a main part of the nitride semiconductor layer in the manufacturing process corresponding to the flowchart of FIG. 1.

Figure 2:
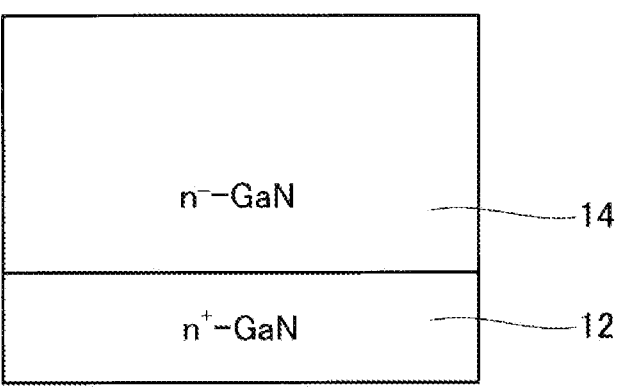
FIG. 2 is a schematic cross-sectional view of a main part of a nitride semiconductor layer in one manufacturing process of a method for manufacturing a nitride semiconductor device.

First, as shown in FIG. 2, a semiconductor substrate 12 is prepared, and a first nitride semiconductor layer 14 of a nitride semiconductor is formed on the semiconductor substrate 12 by using an epitaxial growth technique (step S1 in FIG. 1). The semiconductor substrate 12 may be any material as long as a crystal growth of a nitride semiconductor is performed. In this example, the material of the semiconductor substrate 12 is gallium nitride (GaN) including a n type impurity at a high concentration. The first nitride semiconductor layer 14 may not be particularly limited, but may be formed on the semiconductor substrate 12 by using, for example, MOCVD (Metal Organic Chemical Vapor Deposition) technique. In this example, the material of the first nitride semiconductor layer 14 is gallium nitride (GaN) including a n type impurity at a low concentration.

The first nitride semiconductor layer 14 is formed with various diffusion regions providing a functional structure that exerts an electrical function. Such a functional structure includes, for example, a type of functional structure called a MISFET (Metal Insulator Semiconductor Field Effect Transistor) and a MOSFET (Metal Oxide Semiconductor Field Effect Transistor) that exerts a switching function, or a type of a functional structure referred to as a diode that exerts a rectifying action may be exemplified. The first nitride semiconductor layer 14 may correspond to a drift region constituting such a MISFET and MOSFET, or may correspond to a high resistance region or a cathode region constituting a diode. Hereinafter, a method of forming a p type diffusion region in the first nitride semiconductor layer 14 will be described. Such a p type diffusion region may be a p type body region or a p type body contact region in the MISFET and MOSFET, or may be a p type anode region in the diode.

Figure 3:
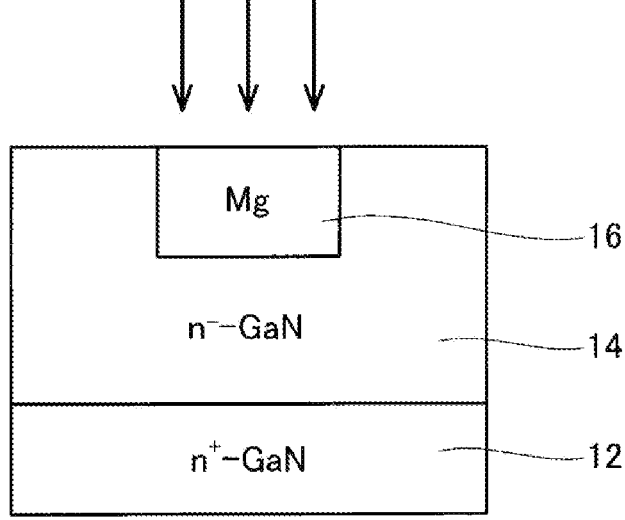
FIG. 3 is a schematic cross-sectional view of a main part of a nitride semiconductor layer in one manufacturing process of a method for manufacturing a nitride semiconductor device.

Next, as shown in FIG. 3, the ion implantation technique is used to implanting a p type impurity into a part of the upper surface of the first nitride semiconductor layer 14, and the p type impurity is introduced into a part of the upper layer portion of the first nitride semiconductor layer 14, so that a p type impurity introduction region 16 is formed (at step S2 in FIG. 1). The p type impurity introduction region 16 is formed at a position exposed on the upper surface of the first nitride semiconductor layer 14. The p type impurity may not be particularly limited, but may be, for example, magnesium (Mg). The p type impurity may be beryllium (Be) instead of magnesium. Further, in order to promote activation, nitrogen (N) may be injected into the p type impurity introduction region 16 as needed.

Figure 4:
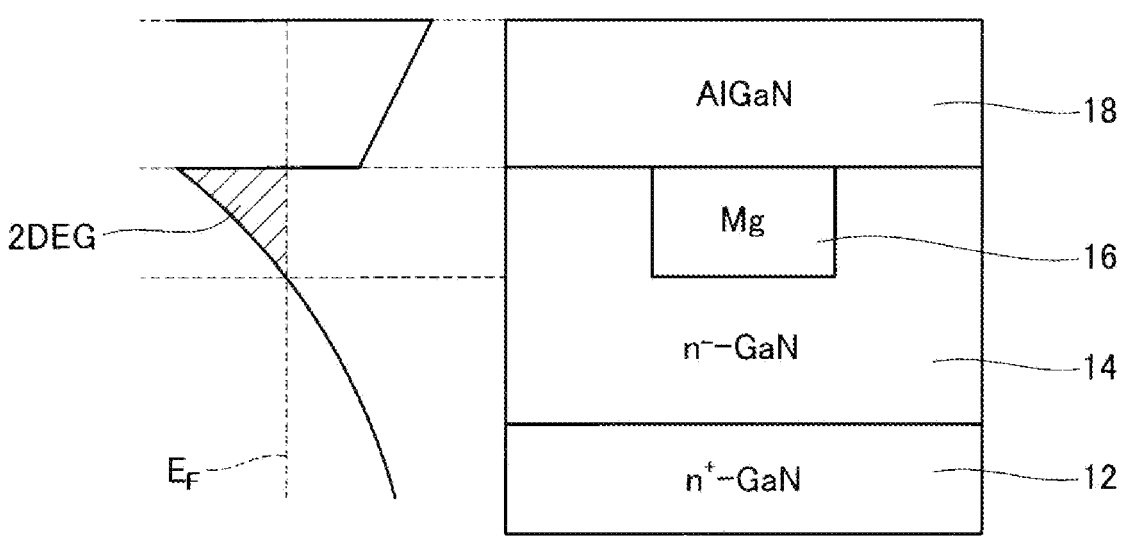
FIG. 4 is a schematic cross-sectional view of a main part of a nitride semiconductor layer in one manufacturing process of a method for manufacturing a nitride semiconductor device.

Next, as shown in FIG. 4, the second nitride semiconductor layer 18 of the nitride semiconductor is formed on the first nitride semiconductor layer 14 by using the epitaxial growth technique (at step S3 in FIG. 1). The second nitride semiconductor layer 18 may not be particularly limited, but may be coherently grown and formed on the first nitride semiconductor layer 14 by using, for example, MOCVD technology. Here, coherent growth means a growth with maintaining the continuity of the lattice at the interface between the first nitride semiconductor layer 14 and the second nitride semiconductor layer 18 by distorting the lattice of the second nitride semiconductor layer 18 when the second nitride semiconductor layer 18 is grown as a crystal although there is a lattice mismatch between the first nitride semiconductor layer 14 and the second nitride semiconductor layer 18. The second nitride semiconductor layer 18 is a nitride semiconductor having a band gap different from that of the first nitride semiconductor layer 14. Typically, the second nitride semiconductor layer 18 is a nitride semiconductor having a bandgap larger than that of the first nitride semiconductor layer 14. In this example, the second nitride semiconductor layer 18 is made of non-doped or n type aluminum nitride gallium (AlGaN).

Since the second nitride semiconductor layer 18 is coherently grown from the upper surface of the first nitride semiconductor layer 14 to form a film, as shown in FIG. 4, a two-dimensional electron gas layer (2 DEG) is formed on the first nitride semiconductor layer 14 side of the heterojunction surface between the first nitride semiconductor layer 14 and the second nitride semiconductor layer 18 by piezo-polarization. The EF in the drawings indicates the Fermi level. As described above, the upper layer portion of the first nitride semiconductor layer 14 is a n type region, and at least a part of the p type impurity introduction region 16 is the n type region, that is located in the two-dimensional electron gas layer (2 DEG).

Next, the anneal treatment is performed in a state where the second nitride semiconductor layer 18 is formed on the first nitride semiconductor layer 14 (at step S4 in FIG. 1). The annealing temperature may not be particularly limited, but may be, for example, 1300° C. to 1500° C. The formation energy for replacing magnesium (Mg), which is a p type impurity, with gallium (Ga), that is, the energy required for activating magnesium, depends on the position of the Fermi level of the p type impurity introduction region 16. The closer the position of the Fermi level of the p type impurity introduction region 16 is to the valence band, that is, when the p type impurity introduction region 16 has the n type, the lower the energy required to activate magnesium. Since this anneal treatment is carried out in a state where a two-dimensional electron gas layer (2 DEG) is formed on the upper layer portion of the first nitride semiconductor layer 14, the anneal treatment is performed under a condition that at least a part of the p type impurity introduction region 16 is disposed in the n type region. Therefore, the p type impurity in the p type impurity introduction region 16 can be activated with low energy. Further, the maximum concentration of the p type impurity introduced into the p type impurity introduction region 16 is adjusted to be smaller than the maximum charge density in the two-dimensional electron gas layer (2 DEG). Therefore, the upper layer portion of the first nitride semiconductor layer 14 is maintained in the n type region during the annealing treatment. As a result, the p type impurity introduced into the p type impurity introduction region 16 can be activated with high efficiency.

Figure 5:
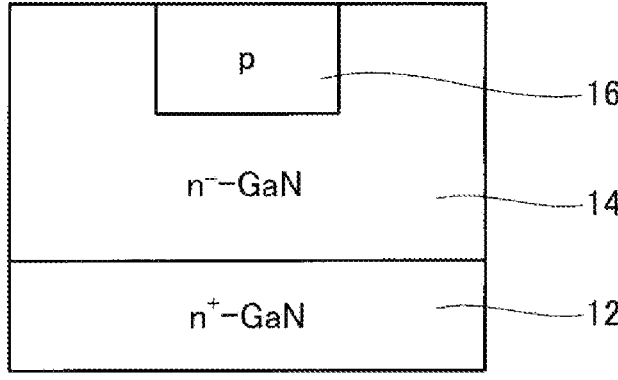
FIG. 5 is a schematic cross-sectional view of a main part of a nitride semiconductor layer in one manufacturing process of a method for manufacturing a nitride semiconductor device.

Next, as shown in FIG. 5, the second nitride semiconductor layer 18 is removed (at step S5 in FIG. 1). When the second nitride semiconductor layer 18 is removed, the piezoelectric polarization disappears, and the p type impurity introduction region 16 becomes a p type region. In this way, a highly active p type region can be formed in the upper layer portion of the first nitride semiconductor layer 14.

Figure 6:
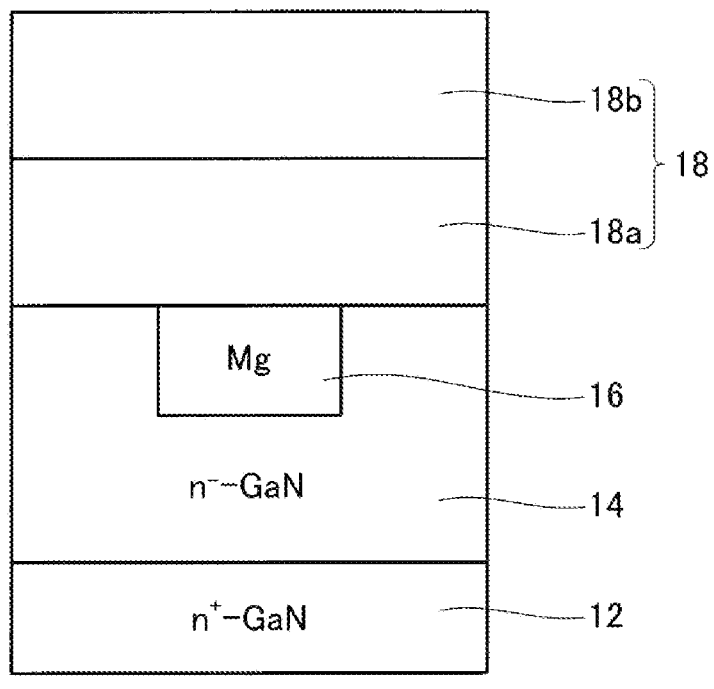
FIG. 6 is a schematic cross-sectional view of a main part of a nitride semiconductor layer in one manufacturing process of a method for manufacturing a nitride semiconductor device.

In the above example, the second nitride semiconductor layer 18 is made of one nitride semiconductor layer. Instead of this example, as shown in FIG. 6, the second nitride semiconductor layer 18 may be made of a plurality of layers. FIG. 6 shows an example in which the lower nitride semiconductor layer 18a and the upper nitride semiconductor layer 18b are stacked. The lower nitride semiconductor layer 18a and the upper nitride semiconductor layer 18b may not be particularly limited, but may be coherently grown on the first nitride semiconductor layer 14 and formed in order by using, for example, MOCVD technology.

For example, the lower nitride semiconductor layer 18a and the upper nitride semiconductor layer 18b may be made of AlGaN, and may be configured so that the composition ratio of aluminum is different from each other. As an example, the lower nitride semiconductor layer 18a may be $Al_{0.2}Ga_{0.8}N$ and the upper nitride semiconductor layer 18b may be $Al_{0.4}Ga_{0.6}N$. When the composition ratio of aluminum in the lower nitride semiconductor layer 18a in contact with the first nitride semiconductor layer 14 is small, the lattice mismatch between the first nitride semiconductor layer 14 and the lower nitride semiconductor layer 18a is suppressed, and occurrence of cracks at the time of the annealing treatment is suppressed. When the composition ratio of aluminum in the upper nitride semiconductor layer 18b on the outermost surface is large, nitrogen escape from the surface of the upper nitride semiconductor layer 18b is suppressed, so that the heat resistance is improved. In order to ensure practical heat resistance, the composition ratio of aluminum in the upper nitride semiconductor layer 18b may be 40% or more. Instead of the two distinct stacking structures of the lower nitride semiconductor layer 18a and the upper nitride semiconductor layer 18b, the second nitride semiconductor layer 18 may have a construction with three or more layers so as to increase an aluminum composition ratio in multiple stages from the first nitride semiconductor layer 14 side toward the outermost surface. Alternatively, the composition ratio of aluminum may continuously increase from the first nitride semiconductor layer 14 side toward the outermost surface. Alternatively, the second nitride semiconductor layer 18 may have a structure with a combination of the above constructions. In any case, the composition ratio of aluminum in the second nitride semiconductor layer 18 may be configured such that the portion in contact with the first nitride semiconductor layer 14 is the minimum value and the outermost surface is the maximum value. As a result, it is possible to achieve both suppression of cracks and suppression of nitrogen leakage extremely well.

For example, the lower nitride semiconductor layer 18a may be indium aluminum nitride (InAlN), and the upper nitride semiconductor layer 18b may be aluminum gallium nitride (AlGaN). The charge density of the two-dimensional electron gas layer (2 DEG) formed on the heterojunction surface of InAlN/GaN is higher than the charge density of the two-dimensional electron gas layer (2 DEG) formed on the heterojunction surface of AlGaN/GaN. Therefore, when the lower nitride semiconductor layer 18a is made of indium nitride (InAlN), a high-density two-dimensional electron gas layer (2 DEG) is formed on the upper layer portion of the first nitride semiconductor layer 14. Therefore, even if the p type impurity concentration of the p type impurity introduction region 16 is increased, the n type region can be maintained during the annealing treatment, so that the p type high concentration region is formed in the upper layer portion of the first nitride semiconductor layer 14.

The features of the techniques disclosed in the present disclosure are summarized below. It should be noted that the technical elements described below are independent technical elements and exhibit technical usefulness alone or in various combinations, and are not limited to the combinations described in the present description at the time of filing.

The method for manufacturing a nitride semiconductor device disclosed in the present specification includes: a p type impurity introducing step for introducing a p type impurity into at least a part of an upper layer portion of a first nitride semiconductor layer to form a p type impurity introduction region; a film forming step for forming a second nitride semiconductor layer on an upper surface of the first nitride semiconductor layer so as to include the p type impurity introduction region, wherein the second nitride semiconductor layer is formed by coherently growth in the film forming step; and an anneal treatment step for performing anneal treatment under a condition that the second nitride semiconductor layer is formed on the first nitride semiconductor layer. The second nitride semiconductor layer may be a nitride semiconductor having a band gap different from that of the first nitride semiconductor layer. Typically, the second nitride semiconductor layer may be a nitride semiconductor having a larger bandgap than the first nitride semiconductor layer.

In the film forming step, the second nitride semiconductor layer may be formed by stacking nitride semiconductors having different composition ratios. For example, the first nitride semiconductor layer may be made of GaN and the second nitride semiconductor layer may be made of AlGaN. In this case, in the second step, the second nitride semiconductor layer may be formed so that the composition ratio of aluminum increases from the first nitride semiconductor layer side toward the outermost surface. It is possible to suppress both crack generation and nitrogen release. Alternatively, the first nitride semiconductor layer may be made of GaN, and the second nitride semiconductor layer may be made of stacking layers of InAlN and AlGaN. A high-concentration p type region can be formed in the upper layer portion of the first nitride semiconductor layer.

When the first nitride semiconductor layer is made of GaN, the annealing temperature in the annealing treatment step may be 1300° C. to 1500° C. The energy required to activate the p type impurities can be added.

In the film forming step, the second nitride semiconductor layer may be formed by using the MOCVD technique.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A manufacturing method of a nitride semiconductor device, the manufacturing method comprising:
   introducing a p type impurity into at least a part of an upper layer portion of a first nitride semiconductor layer to form a p type impurity introduction region;
   forming a second nitride semiconductor layer from an upper surface of the first nitride semiconductor layer so as to include the p type impurity introduction region, the second nitride semiconductor layer being coherently grown and formed, and the p type impurity introduction region being formed at a position exposed on the upper surface of the first nitride semiconductor layer;
   performing an anneal treatment after the second nitride semiconductor layer is formed on the first nitride semiconductor layer and on the p type impurity introduction region at the position exposed on the upper surface of the first nitride semiconductor layer in a state where at least a part of the p type impurity introduction region is disposed in a two-dimensional electron gas layer of the first nitride semiconductor layer; and removing the second nitride semiconductor layer from the first nitride semiconductor layer after performing the anneal treatment, wherein:

in the forming the second nitride semiconductor layer, the second nitride semiconductor layer is formed by stacking nitride semiconductor layers having different composition ratios, the first nitride semiconductor layer is made of GaN, the second nitride semiconductor layer is comprised of a lower second nitride semiconductor layer formed of InAlN that is adjacent to the first nitride semiconductor layer and an upper second nitride semiconductor layer formed of AlGaN and stacked on top of the lower second nitride semiconductor layer, an upper layer portion of the first nitride semiconductor layer becomes an n type region;

at least a part of the p type impurity introduction region is disposed in the n type region of the first nitride semiconductor layer; and the anneal treatment is performed in a state where the upper layer portion of the first nitride semiconductor layer is the n type region, and the maximum concentration of the p type impurity introduced into the p type impurity introduction region is adjusted to be smaller than the maximum charge density in the two-dimensional electron gas layer.

2. The manufacturing method of the nitride semiconductor device according to claim 1, wherein:

in the forming of the second nitride semiconductor layer, the second nitride semiconductor layer is formed so as to increase a composition ratio of aluminum from a first nitride semiconductor layer side toward an outermost surface.

3. The manufacturing method of the nitride semiconductor device according to claim 2, wherein:

an annealing temperature in the performing of the anneal treatment is disposed between 1300° C. and 1500° C.

4. The manufacturing method of the nitride semiconductor device according to claim 1, wherein:

in the forming of the second nitride semiconductor layer, the second nitride semiconductor layer is formed by a MOCVD technique.

5. The manufacturing method of the nitride semiconductor device according to claim 1, wherein:

removing the second nitride semiconductor layer from the first nitride semiconductor layer includes removing the entire second nitride semiconductor layer.

6. The manufacturing method of the nitride semiconductor device according to claim 1, wherein:

introducing the p type impurity comprises using an ion implantation technique to implant the p type impurity into the first nitride semiconductor layer.

7. The manufacturing method of the nitride semiconductor device according to claim 6, wherein:

introducing the p type impurity further comprises injecting nitrogen into the p type impurity introduction region.

* * * * *